United States Patent
Ishida et al.

(10) Patent No.: US 6,801,824 B2
(45) Date of Patent: Oct. 5, 2004

(54) SUBSTRATE SELECTOR

(75) Inventors: Kouji Ishida, Tokyo (JP); Kiyoshi Yamazaki, Tokyo (JP); Hideyuki Nara, Tokyo (JP); Hajime Seino, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/049,051

(22) PCT Filed: May 28, 2001

(86) PCT No.: PCT/JP01/04427
§ 371 (c)(1),
(2), (4) Date: May 10, 2002

(87) PCT Pub. No.: WO01/95029
PCT Pub. Date: Dec. 13, 2001

(65) Prior Publication Data
US 2002/0173870 A1 Nov. 21, 2002

(30) Foreign Application Priority Data
Jun. 2, 2000 (JP) ........................ 2000-166248
Jul. 31, 2000 (JP) ........................ 2000-232215

(51) Int. Cl.$^7$ .................... G06F 19/00; H01L 21/66
(52) U.S. Cl. .................... 700/121; 700/110; 438/14; 702/81
(58) Field of Search .................... 700/96, 109, 110, 700/115, 117, 121; 438/14; 702/81, 83, 84; 716/19, 21

(56) References Cited

U.S. PATENT DOCUMENTS

| | | | |
|---|---|---|---|
| 4,586,822 A | * | 5/1986 | Tanimoto .................... 356/394 |
| 5,754,432 A | * | 5/1998 | Komatsuzaki et al. ....... 700/110 |
| 5,786,231 A | * | 7/1998 | Warren et al. ................ 438/17 |
| 5,801,965 A | * | 9/1998 | Takagi et al. ............... 700/110 |
| 5,831,865 A | * | 11/1998 | Berezin et al. ............. 700/110 |
| 5,991,699 A | * | 11/1999 | Kulkarni et al. .............. 702/83 |
| 6,319,733 B1 | * | 11/2001 | Ozaki .......................... 438/14 |
| 6,505,090 B1 | * | 1/2003 | Harakawa ................... 700/121 |
| 6,620,632 B2 | * | 9/2003 | Koveshnikov et al. ........ 438/14 |
| 2002/0078710 A1 | * | 6/2002 | Takeuchi et al. ............... 65/31 |

FOREIGN PATENT DOCUMENTS

JP        A1 09-51028      2/1997

* cited by examiner

Primary Examiner—Paul Rodriguez
(74) Attorney, Agent, or Firm—Rader, Fishman & Grauer PLLC

(57) ABSTRACT

Substrate-selecting equipment selects substrates used for objective products from among a group of substrates with photosensitive material layers used for the production of photomask. The substrate-selecting equipment comprises one or more of the defect-registering part(s) for registering the results of the inspection of defects of substrates with photosensitive material layers in database, the photosensitive material layer lot check result-registering part for registering the results of check of lots of photosensitive material layers in database and the substrate-selecting part for selecting substrates used for the production of objective products from among a group of substrates with photosensitive material layers, on the basis of the results of inspection of defects and the results of check of lots of photosensitive materials registered in database.

9 Claims, 6 Drawing Sheets

FIG. 2

| SUBSTRATE Z | | |
|---|---|---|
| SIZE OF DEFECT | X-AXIS OF DEFECT COORDINATES | Y-AXIS OF DEFECT COORDINATES |
| 0.1 | -1000 | 1000 |
| 0.5 | 2000 | 3000 |
| 0.25 | 10000 | -2000 |
| SUBSTRATE Y | | |
| SIZE OF DEFECT | X-AXIS OF DEFECT COORDINATES | Y-AXIS OF DEFECT COORDINATES |
| 0.3 | 3000 | 1000 |
| 0.1 | 2000 | -2000 |
| ⋮ | | |

FIG. 3

| SUBSTRATE | SIZE OF SUBSTRATE | SHILDING FILM | PHOTOSENSITIVE MATERIAL LAYER | DATE OF APPLICATION | WRITER | AMOUNT OF EXPOSURE |
|---|---|---|---|---|---|---|
| Z | 6(0.25) | Cr | A | 2000/2/2 | D1 | +a |
| Y | 6(0.25) | Cr | A | 2000/2/2 | D1 | +a |
| Y | 6(0.25) | Cr | B | 2000/2/8 | D2 | -b |
| W | 6(0.25) | Cr | C | 2000/3/1 | D1 | +c |
| U | 6(0.25) | Cr | C | 2000/3/1 | D1 | +c |
| ⋮ | | | | | | |

| DESIGN RULE | PATTERN AREA | RANK OF THE RESULTS OF INSPECTION OF PINHOLE DEFECTS | RANK OF THE RESULTS OF INSPECTION OF FOREIGN DEFECTS |
|---|---|---|---|
| 0.25 | 10000,10000 | A | B |
| 0.35 | 15000,15000 | B | C |
| ⋮ | | | |

(a)

(b)

(c)

$P1 = 1 - \dfrac{S1 \times d}{L \times L}$

P1: THE PROBABILITY THAT DEFECT 611 DOES NOT EXTEND OVER CIRCUMFERENCE OF PATTERNS 651 AND 652

SUBSTRATE SELECTOR

TECHNICAL FIELD

The present invention relates to substrate-selecting equipment for a photomask used for the production of a semiconductor integrated circuit and in particular to substrate-selecting equipment for selecting a substrate used for an objective product from among a group of substrates with photosensitive material layer used for the production of photomasks.

BACKGROUND ART

In recent years, the desire for high-integration and high-function has increased for various LSI typified by ASIC as a result of the tendency of electric equipment becoming more efficient, lighter, thinner, shorter and smaller. In a photomask used for the production of a semiconductor integrated circuit, forming patterns of a photomask with high efficiency and high quality has come to be desired.

Heretofore, the production of a photomask is carried out generally through the steps shown in FIG. 8.

First, as shown in FIG. 8(a), a substrate (it is called "blanks") provided with a shielding film or shifter layer 820 made of a metallic thin film such as chromium formed on a transparent substrate 810 by sputtering and others is provided.

Then, as shown in FIG. 8(b), a photosensitive material layer 830 such as a photosensitive resin film, photosensitive resist or merely resist is laminated on a shielding film or shifter layer 820, and then dried by heating to remove any solvent remaining in the photosensitive material layer and to improve the adhesion between the metallic thin film 820 and the transparent substrate 810.

Then, as shown in FIG. 8(c), ionizing radiation 840, such as an EB (Electron Beam), a laser beam, or an X-ray, is applied so as to selectively expose the ionizing radiation 840 into a desired pattern. Generally, the ionizing radiation 840 is selectively exposed by the fixed equipment according to pattern data for the formation of the pattern. Therefore, it is also called "pattern writing" or merely "writing".

Then, as shown in FIG. 8(d), the photosensitive material layer 830 is developed to form a resist pattern 835. Thereafter, as shown in FIG. 8(e), areas of the shielding layer 820 made of the metallic thin film exposed within the openings 836 of the resist pattern 835 are etched so that shielding layer pattern 825 is formed.

Finally, the resist pattern 835 is removed so that a photomask formed from the shielding layer pattern 825 can be obtained, as shown in FIG. 8(f). Thereafter, inspection and correction of pattern are carried out according to demand so that a desired photomask is obtained.

The quality of photomask produced in the above-mentioned process is greatly affected by the quality of the substrate with a photosensitive material layer employed for pattern writing. Since there are many types of substrates having a photosensitive material layer thereon, the control of substrates having a photosensitive material layer thereon is difficult. Heretofore, the distinction between good products and poor products is carried out according to the regular standard in the inspection in the process of production so that only good products are employed.

However, the specifications of quality for objective products are various, and substrates with photosensitive material layers distinguished as good products are varied in the phase of quality and the sensitivity of photosensitive material layers. Therefore, substrates corresponding to the specifications of objective products are not always selected. Accordingly, there are cases where the influence of the used substrate on the inspection and correction thereof was considerable.

Further, as circuits of semiconductor products such as LSI chips increase in density, the desire for the formation of patterns having higher accuracy and quality has also increased.

It is an object of the present invention to provide a substrate-selecting equipment wherein substrates used for the production of objective products can be successfully selected from among a group of substrates with photosensitive material layers used for the production of photomasks employed for writing of patterns in the process of photomask, particularly from the phase of quality of products.

DISCLOSURE OF THE INVENTION

The present invention is a substrate-selecting equipment for selecting substrates used for objective products from among a group of substrates with photosensitive material layers used for the production of photomask, wherein the substrate-selecting equipment comprises one or more of the defect-registering part(s) for registering the results of the inspection of defects of substrates with photosensitive material layers in database, the photosensitive material layer lot check result-registering part for registering the results of check of lots of photosensitive material layers in database and the substrate-selecting part for selecting substrates used for the production of objective products from among a group of substrates with photosensitive material layers, on the basis of the results of inspection of defects and the results of check of lots of photosensitive materials registered in database.

Further, in the above-mentioned substrate-selecting equipment, the defect-registering part is comprised of the pinhole defect-registering part for registering the results of inspection of pinhole defects of blanks in which photosensitive material layers are not laminated on substrates in database and the foreign substance defect-registering part for registering the results of inspection of foreign substance in database.

Furthermore, the above-mentioned substrate-selecting equipment further comprises the selection standard-registering part for registering the quality standard of substrates which is the standard of selection of substrates in database, wherein the substrate selection part selects substrates used for the production of objective products, on the basis of the information on the results of check of lots of photosensitive material layers and the quality standard of substrates which is the standard of the selection of substrates, according to demand.

Further, the above-mentioned substrate-selecting equipment further comprises the in pattern area existing defect extracting part for extracting defects existing in a pattern area on a photomask. For the substrate produced, defects existing in a pattern area on a photomask are extracted on the basis of the information from the results of inspection of defects of each substrate and on the basis of the information from the results of check of lots of photosensitive material layers registered in database.

Further, the above-mentioned substrate-selecting equipment further comprises the defect probability-calculating part for calculating the probability that no defect happens or the probability that happen in the surrounding part of a pattern of photomask produced or for calculating the probability that no defect happens or the probability that defects happen inside a pattern of photomask produced, corresponding with the patterns of photomask produced every substrate, on the basis of the information on the results of inspection of defects of each substrate and the information on the results of check of lots of photosensitive material layers registered in a database for candidate substrate nominated for candidate of substrate used for photomask to be produced, and wherein the substrate-selecting part selects substrates used for the production of objective products, on the basis of the probability that no defect happens or the probability that defects happen in the surrounding part of pattern every substrate obtained in the defect probability-calculating part, or from the probability that no defect happens or the probability that defects happen over the whole of pattern, according to demand.

Further, in the above-mentioned substrate-selecting equipment, in the defect probability-calculating part, defect areas having the size larger than the size of defects decided considering errors, corresponding to the position of defect on photomask to be produced, are obtained for all the defects in a substrate, and the non-occurrence probabilities that no defect happens in the surrounding part of patterns in the obtained defect areas are obtained for all the defects in a substrate. Further, the product of non-occurrence probabilities for all the defects in a substrate are obtained, wherein the above-mentioned product corresponds to the probability P0 that no defect happens in the surrounding part of patterns on a photomask on a substrate.

In the above-mentioned substrate-selecting equipment, in the defect probability-calculating part, defect areas having the size larger than the size of defects decided considering errors, corresponding to the position of defect on photomask to be produced, are obtained for all the defects in a substrate, and the non-occurrence probabilities that no defect happens inside patterns in the obtained defect area are obtained for all the defects in a substrate. Further, the product of non-occurrence probabilities for all the defects in a substrate are obtained, wherein the above-mentioned product corresponds to the probability P01 that no defect happens over the whole of patterns on a photomask on a substrate.

The above-mentioned probability includes (approximate) probabilities having substantially meanings, which probabilities are calculated by approximate calculation.

Further, patterns on a photomask are formed the steps shown in FIG. 8, wherein ionizing radiation 840 such as an EB (Electron Beam), a laser beam, or an X-ray is applied to photosensitive material layer 830 of substrate with photosensitive material layer so as to selectively expose the photosensitive material layer to the ionizing radiation into a desired pattern by which latent image thereof is formed. Generally, ionizing radiation 840 is selectively exposed by the fixed equipment according to pattern data for the formation of pattern. Therefore, it is also called "pattern writing" or merely "writing" and a pattern area on a photomask is also called "writing area".

The substrate-selecting equipment of the present invention having the above-mentioned constitution enables the provision of the substrate-selecting equipment in which substrates used for the provision of objective products can be successfully selected from among a group of substrates with photosensitive material layers employed for writing of pattern in the provision of photomask, particularly from the phase of quality of product.

This is achieved by the substrate-selecting equipment for selecting substrates used for objective parts from among a group of substrates with photosensitive material layers used for the production of photomask, wherein the substrate-selecting equipment comprises one or more of the defect-registering part(s) for registering the results of the inspection of defects of substrates with photosensitive material layers in database, the photosensitive material layer lot check result-registering part and the substrate-selecting part for selecting substrates used for the production of objective products from among a group of a group of substrates with photosensitive material layer on the basis of the results of inspection of defects and the results of check of lots of photosensitive material layers registered in database.

The above-mentioned substrate-selecting equipment further comprises the selection standard-registering part for registering the quality standard (it is called also "rank") of substrates which is the standard of selection of substrates in database, wherein the substrate selection part can select substrates used for the production of objective products on the basis of the information on the results of check of lots of photosensitive material layers and the quality standard of substrates which is the standard of the selection of substrates, according to demand.

Further, the above-mentioned substrate-selecting equipment further comprises the defect probability-calculating part wherein the probability that no defect happens or the probability that defects happen in the surrounding part of a patterns on photomask produced is extracted corresponding with the patterns of photomask to be produced every substrate, on the basis of the information of the results of inspection of defects of each substrate and the information on the results of check of the lot of photosensitive material layers registered in a database for candidate substrate nominated for candidate of substrate used for photomask to be produced, and wherein the substrate-selecting part can select substrates used for the production of objective products on the basis of the probability that no defect happens or the probability that defects happen in the surrounding part of pattern every substrate obtained in the defect probability-calculating part, or from the probability that no defect happens or the probability that defects happen in the whole of pattern, according to demand.

BRIEF DESCRIPTION OF DRAWING

FIG. 2 is a view showing an example of data on the results of inspection of defects.

FIG. 3 is a view showing an example of data on the results of check of lots of photosensitive layers.

BEST MODE FOR CARRYING OUT THE INVENTION

Figure 1:
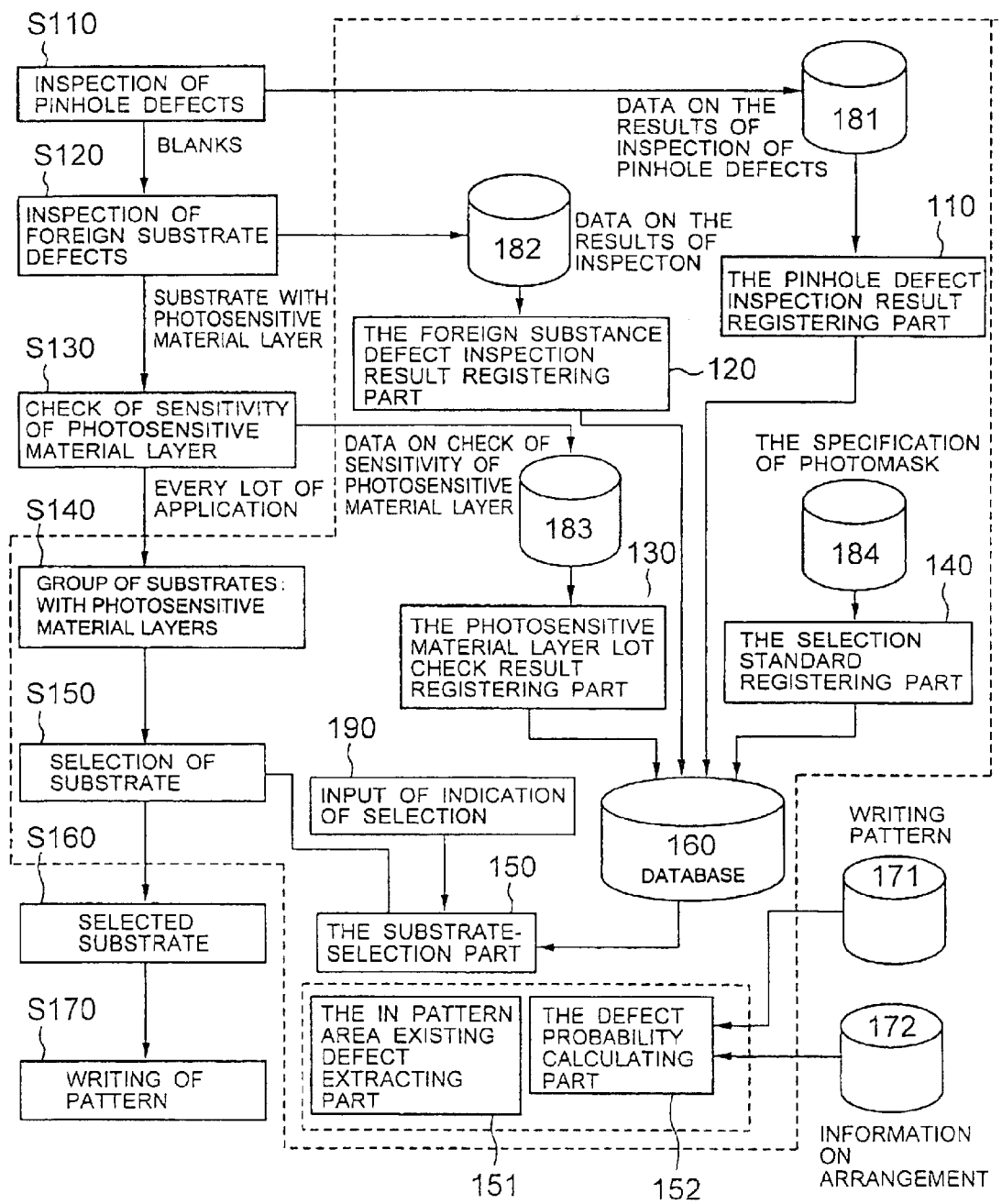
FIG. 1 is a schematic view showing a substrate-selecting equipment of the present invention.

Referring to drawings, an example a substrate-selecting equipment of the present invention is explained. In FIG. 1, the substrate-selecting equipment and the step of the selection of substrate (S150) are shown. Further, steps of S110 to S170 shown in FIG. 1 and steps of S510 to S540 shown in FIG. 6 are steps of processing.

Figure 6:
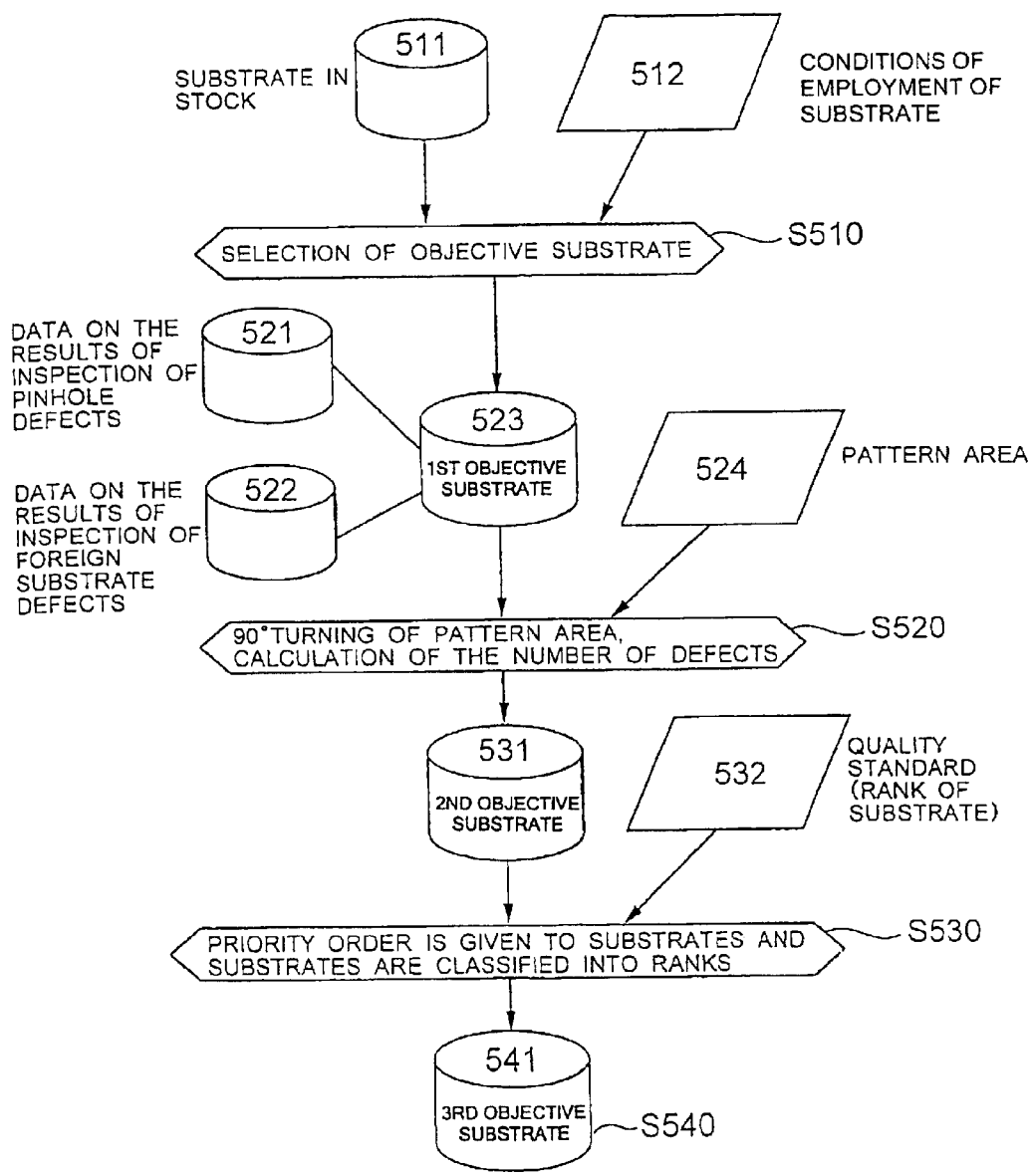
FIG. 6 is a flow diagram showing an example of procedures of the choice of substrate referring to a view of selection of substrate.
Figure 7:
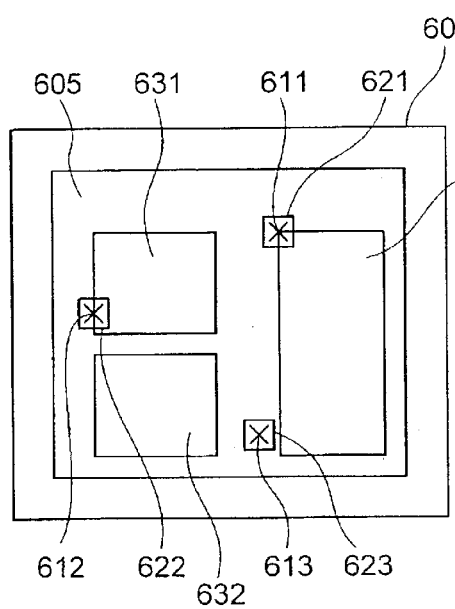
FIG. 7 is a view for explaining an example of the action of a defect probability-calculating part.
Figure 7:
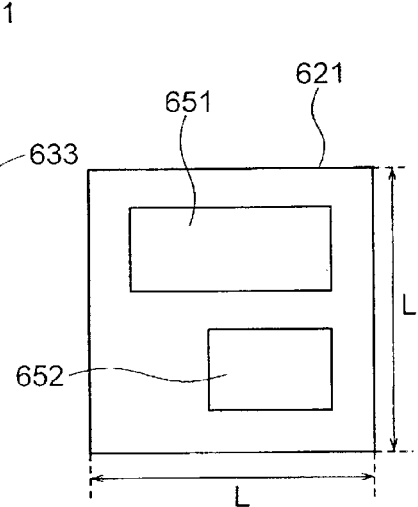
Figure 7:
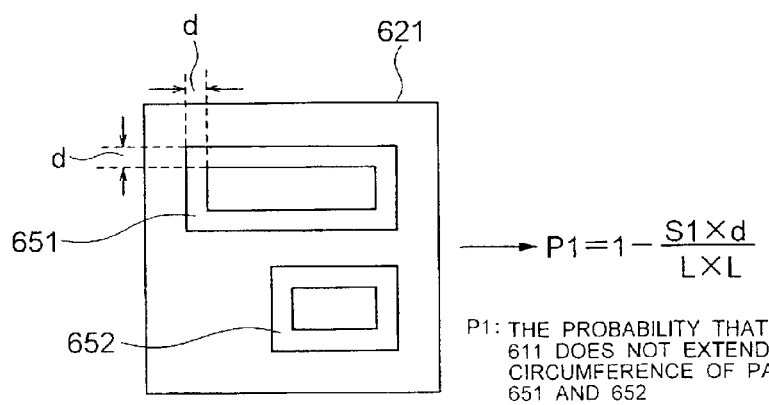
Figure 8:
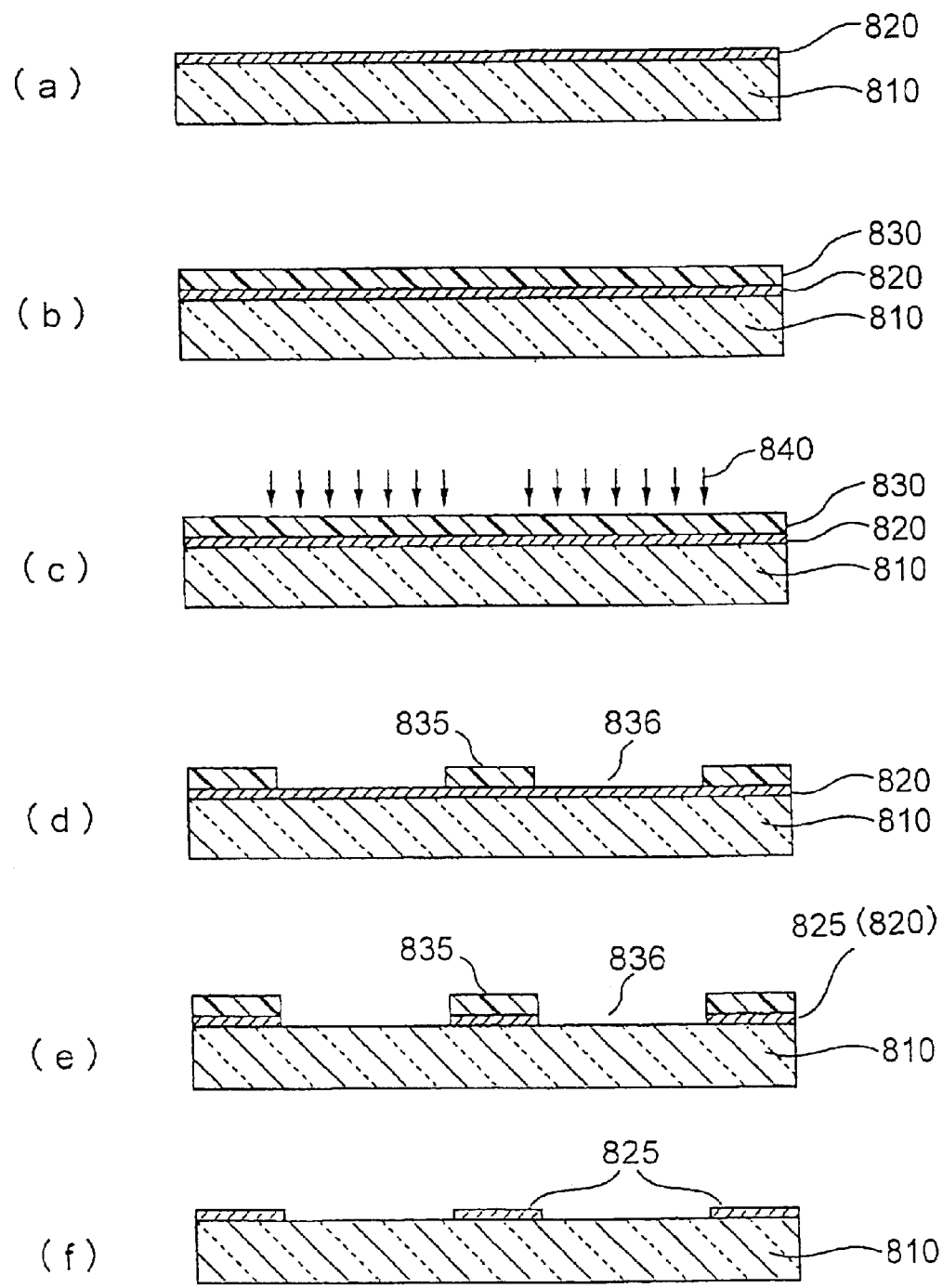
FIG. 8 is a view for explaining a process of producing a photomask.

In FIGS. 1, 6 and 7, numeral 110 designates the pinhole defect inspection result-registering part for registering the results of inspection of pinhole defects; numeral 120 designates the foreign substance defect inspection result-registering part for registering the results of inspection of foreign substance defects; numeral 130 designates the photosensitive material layer lot checking result-registering part for registering the results of check of lots of photosensitive material layers; numeral 140 designates the selection standard-registering part for registering the standard of selection of substrate; numeral 150 designates the substrate-selecting part for selecting an objective substrate; numeral 151 designates the in pattern area happening defect extracting part for extracting defects which happen within a pattern area; numeral 152 designates the defect probability-calculating part for calculating the probability that defects will happen; numeral 160 designates database; numeral 171 designates writing pattern; numeral 172 designates the information on arrangement; numeral 181 designates data on the results of inspection of pinhole defects; numeral 182 designates data on the results of inspection of foreign substance defects; numeral 183 designates data on the results of a check on the sensitivity of lots of photosensitive material layers; numeral 184 designates the specification of photomask; numeral 190 designates the selection indication input for indicating the selection of substrate; numeral 511 designates substrates in stock; numeral 512 designates the conditions of employment of substrate; numeral 521 designates data on the results of inspection of pinhole defects; numeral 522 designates data on the results of inspection of the defects of foreign substrate; numeral 523 designates 1st objective substrates; numeral 524 designates a pattern area; numeral 531 designates a 2nd objective substrate; numeral 532 designates the quality standard (rank of substrate); numeral 541 designates 3rd objective substrate; numeral 601 designates an area of substrate; numeral 605 designates a pattern area (writing area); numerals 611, 612, and 613 designate defects, respectively; numerals 621, 622 and 623 designate areas of defects, respectively; numerals 631, 632 and 633 designate pattern data, respectively; and numerals 651 and 652 designates a pattern, respectively.

An example the substrate-selecting equipment of the present invention is a substrate-selecting equipment for selecting substrate qualitatively corresponding to an objective product from among a group of substrates provided with photosensitive material layer used for producing a photomask, wherein the selected substrate is provided for writing a pattern.

As shown in FIG. 1, a substrate-selecting equipment of the present example comprises the pinhole defect inspection results registering part 110 for registering the results of inspection of pinhole defects (data 181 on the results of inspection of pinhole defects) in database 160, the foreign substance defect inspection result-registering part 120 for registering the results of inspection of foreign substance defects existing in a substrate provided with photosensitive material layers (data 182 on the results of inspection of foreign substance defects) in database 160, the photosensitive material layer lot checking result-registering part 130 for registering the results of check of sensitivity of lots of photosensitive material layers every lot of photosensitive material layers(data 183 on the results of check of inspection of sensitivity of photosensitive material layer every lot of photosensitive material layers) in database 160, the selection standard-registering part 140 for registering the quality standard (the specification 184 of photomask) which is the standard of selection of substrate in database 160 and the substrate-selecting part 150 for selecting a substrate used for the production of objective products which are suitable qualitatively, on the basis of the results of inspection of defects registered in database 160 (data 181 on the results of inspection of pinhole defects and data 182 on the results of inspection of foreign substance defects), the results of check of lots of photosensitive materials and the quality standard which is the standard of selection of substrate.

Described within FIG. 1 is the relation between the steps for processing the substrate occurring before writing is carried out on the substrate and individual parts of a substrate-selecting equipment.

Inspection of pinhole defects (S110) is carried out by the fixed pinhole inspection equipment for blanks. These blanks include a shielding layer or shifter layer made of a thin film of metal such as chromium that is laminated on a transparent substrate made of a material such as quartz. Results of the inspection are stored as data 181 on the results of inspection of pinhole defects. These results are sent through the pinhole defects inspection result-registering part 110 to database 160, and stored within the database 160.

The blanks are cleaned and photosensitive material is applied onto the blanks so that a photosensitive material layer is formed. After forming the photosensitive material layer, inspection (S120) of foreign substance defects is carried out using fixed inspection equipment. The results of the inspection (S120) are stored as data 182 on the results of inspection of foreign substance defects. Further, the results of the inspection (S120) are sent through the foreign substance defect inspection result-registering part 120 to database 160, and stored within the database 160.

A check (S130) of the sensitivity of the photosensitive material layer is carried out using test pieces (test substrates) for every lot of the photosensitive material layers. The results of check (S130) are stored as data 183 on a check of the sensitivity of lots of the photosensitive material layer, sent through the photosensitive material layer sensitivity lot check result-registering part 130 to database 160, and stored within database 160.

On the other hand, many substrates provided with photosensitive material layer (S140), which have been inspected on the sensitivity of photosensitive material layer, are stored in a fixed storage (not shown).

The selection (S150) of substrate for selecting the objective substrate from among a group of substrates provided with photosensitive material layer (S140) is carried out by the equipment of the invention, wherein selection (S160) of a substrate for writing is carried out and writing (S170) of pattern on the substrate is carried out by a writer.

The respective data 181, 182 on inspection of defects, data 183 on the results of the check (S130) of the sensitivity of lots of photosensitive material layers and the specification of photomask, and the selection of the substrate carried out in the substrate-selecting part 150 are explained.

Data from the inspection of defects such as data 181 on the results of inspection of pinhole defects or data 182 on the results of inspection of foreign substance defects are caught on size and position. The location of the defect found on the individual substrate is expressed using the X-Y coordinate system. An example is shown in FIG. 2.

In data 183 on the results of check (S130) of the sensitivity of lots of photosensitive material layers, the sensitivity of individual application lots of the photosensitive materials (such as when the lots differ, for example, according to the date of application) is detected for a individual test piece, and an exposure amount (irradiation amount) corresponding to a writer is determined. The size of the substrate, the type of shielding film, the type of photosensitive material layer, the date of application, the writer, and the exposure amount of the individual substrate are correspondent to each other, wherein the data 183 are expressed as shown in FIG. 3.

In FIG. 3, "+a" indicates an increased exposure amount by +a so to correct the unevenness of the sensitivity between lots of the photosensitive material layers.

Figures 4, 5:
FIG. 4 is a view showing an example of a quality standard.
FIG. 5 is a view showing an example of a process of inputting the selection of substrate.

In the quality standard being the standard of selection of substrate (the specification of photomask 184), the design rule, the pattern area (the size of the "X" direction and the size of the "Y" direction thereof), the rank of the results of inspection of pinhole defects, the rank of the results of inspection of foreign substance defects, and other standards are correspondent to each other, wherein the data 184 are expressed as shown, for example, within FIG. 4.

FIG. 4 shows an example of the quality standard as the substrate standard for writing by a raster-type electron beam writer. As an example, the description written on the first line in a table depicts a pattern area being 10000 μm×10000 μm, the rank of the results of inspection of pinhole defects being "A", and the rank of the results of inspection of foreign substance defects being "B", and 0.25 μm address unit writing.

As another example, an input screen shown in FIG. 5 such as that of a computer terminal display depicts an input (corresponding to "the input of indication of selection 190") in case of selecting a substrate corresponding to an objective product. The input screen depicts fields for selecting quality conditions such as the substrate of a writer, the size of the substrate, the type of shielding film, and the photosensitive material layer, and quality conditions such as the design rule, and the rank of the result of inspection of pinhole defects.

FIG. 6 depicts a flow diagram (algorithm) for the selection by the substrate-selecting part 150 of a substrate that qualitatively corresponds to an objective product.

For example, a substrate is selected according to data 182 on the defects of inspection of defects, data 183 on the results of check of lots of photosensitive material layers, and the quality standard 184 of the substrate. The number of defects existing inside a pattern area of an individual photomask to be produced is extracted for the objective substrate according to the information on the results of inspection of defects registered in database in the in pattern area existing defect extracting part 151 of the substrate-selecting part 150. Each objective substrate is ranked according to the number of defects extracted, and a desired substrate correspondent to the quality standard of substrate is used according to the ranking.

An objective substrate is selected (S510) from among the substrates in stock 511. A 1st objective substrate 523 that is designated by the input of indication of selection 190 corresponds to the conditions of employment of substrate 512 such as a writer, the size of the substrate, the type of shielding film, and the type of photosensitive material layer.

A substrate with a fixed pattern area a 2nd objective substrate 531) is selected from among the 1st objective substrates 523 referring to data 521 on the results of inspection of pinhole defects and data 522 on the results of inspection of foreign substance defects. The number of defects existing in a pattern area is obtained for the fixed pattern area and for a pattern area turned by 90° from the fixed pattern area, respectively (S520).

The number of defects existing in a fixed pattern area can change by turning the pattern area by 90°.

Substrates are selected from among the 2nd objective substrates 531 according to the quality standard (rank of substrate) 532. In this regard, the 2nd objective substrates 531 are prioritized and classified by rank (S530) and a 3rd objective substrate 541 is obtained (S540).

Rank is given to the 3rd objective substrate 541 of objective product and the order of priority is given thereto, wherein a desired substrate corresponding to the specification of quality of objective product is selected from among the 3rd objective substrates 541 so that the selected substrate is introduced to a writer.

FIG. 7 depicts an action of a defect probability-calculating part 152 in which substrates qualitatively corresponding to the objective products are selected in the substrate-selecting part 150.

As explained within FIG. 7, substrates are selected on the basis of the information on the results of inspection of defects and the information on the results of check of lots of photosensitive material layer, wherein the probability P0 that no defect happens on an individual photomask is obtained on the basis of the information on the results of inspection of defects registered in the database. Then, the objective substrates are classified into ranks according to the probability P0, by which a substrate having a desired rank is selected for the production of photomask.

To obtain the probability P0, a probability calculation is carried out for a fixed pattern area of objective substrate and for a pattern area turned by 90° relatively against the fixed pattern area. Then, the objective substrates are classified by the probability P0 of their respective relative angles, and the substrate having a desired rank is selected.

In this case, the objective substrates can be employed more effectively.

A method of obtaining a probability P0 that no defect happens on photomask is explained within FIG. 7. As shown within FIG. 7, there is the fixed relative relation of position between the objective substrate and the pattern areas.

Shown on a photomask are defects 611, 612, 613 and pattern data areas 631, 632, 633 within a writing area 605 on substrate area 601.

The probability that a defect covers the circumference of a pattern inside a pattern data area is calculated for each defect 611, 612, 613. Each of the probabilities P1, P2, P3 that no defect 611, 612, 613 covers the circumference of a respective pattern inside a respective pattern data area 631, 632, 633 is calculated from the probability that a defect covers the circumference of a pattern inside a pattern data area. The probability P0 that no defect happens on photomask is calculated from equation P0=P1×P2×P3.

In this case, the relation of position between the objective substrates, the pattern area, the pattern data area, and the patterns inside the pattern data area is determined according to the writing pattern 171 and the information on arrangement 172, shown in FIG. 1.

As for the probability P1 that defect 611 does not cover the circumference of pattern inside a pattern data area 633, the defect area 621 having the size larger than defect 611 considering errors and corresponding to the position of defect 611 on photomask produced is obtained and the non-occurrence probability P1 that no defect happens in the circumference of a pattern 651, 652 inside the obtained defect area 621 is obtained.

Patterns 651, 652 existing inside defect area 621 (the size of L×L) with the size larger than defect 611 considering errors shown in FIG. 7(a) is patterns 651, 652 as shown as an enlarged view in FIG. 7(b), wherein the defect area 621 is a rectangular area with the length L of one side.

In this case, if the defect 611 has a circle with diameter d and the sum total of perimeters of patterns 651, 652 is S1, then the probability P1 that defect 611 covers a circumference of patterns in a pattern data area is approximated by (S1×d)/(L×L).

Accordingly, the probability P1 that defect 611 does not cover a circumference of patterns 651, 652 in a pattern data area 633 can be calculated by P1=1−[(S1×d)/(L×L)].

Accordingly, the probabilities P2, P3 that defects 612, 613 cover circumferences of patterns in a pattern data area can be calculated.

The probability P0 that no defect happens on a photomask can be obtained from the obtained probabilities P1, P2 and P3.

In a case where there are three pattern areas, the probability P0 that no defect happens on a photomask can be also calculated basically in the same way.

In calculating the probability P0, the presence of defects found within the inside of the patterns is not significant since those defects can be easily corrected.

Where defects 611, 612 and 613 are found within the inside of the patterns, the probability that defects occur is calculable, assuming that the defects can occur within the inside of the patterns.

In this case, for example, in defect area 621 as shown in FIG. 7(b), the probability that circular defect 611 with diameter d strides patterns in a pattern data area can be calculated as Sd/(L×L), wherein Sd designates the sum of areas of patterns 651, 652 which are thickened outward by d/2.

Accordingly, the probability P11 that defect 611 does not stride patterns in a pattern data area can be obtained as P11=1−[Sd/(L×L)].

In the same manner, the probabilities P12, P13 that defects 612, 613 do not stride patterns in a pattern data area can also be obtained. The probability P01 that no defect happens on a photomask can be obtained from the obtained probabilities P11, P12 and P13, including a case where defects exist inside patterns.

INDUSTRIAL APPLICABILITY

As above-mentioned, the present invention made possible to provide a substrate-selecting equipment in which substrates for producing objective products can be selected from the phase of quality of products, from among a group of substrates with photosensitive material layers for forming photomasks with photosensitive material layers, employed for writing of patterns.

Accordingly, the total productivity of production of photomasks can be improved as compared with conventional case. The present invention can cope with the higher precision and the higher quality of photomasks.

What is claimed is:

1. A substrate-selecting equipment comprising:
at least one defect-registering part; a photosensitive material layer lot check result-registering part; a substrate-selecting part; and a defect probability-calculating part, wherein:
said at least one defect-registering part registers within a database a result of inspection, said inspection being for a defect,
said photosensitive material layer lot check result-registering part registers within said database a result of a lot check for a photosensitive material layer on a substrate,
said substrate-selecting part selects an objective substrate from more than one said substrate, said objective substrate being selected by said substrate-selecting part based upon said result of said inspection and said result of said lot check,
based upon said result of said inspection and said result of said lot check, said defect probability-calculating part performs a calculation for said objective substrate of the probability that no defect happens on a photomask, said calculation being used by said substrate-selecting part to select said objective substrate,
said defect and a pattern area are within a defect area, said defect area being larger than said defect,
a location of said defect area corresponds to a defect position on said photomask,
said defect probability-calculating part calculates the probability that said defect happens in a surrounding part of said pattern area and calculates the probability that another defect happens in another surrounding part of another pattern area of said photomask, and said probability that said defect happens in said surrounding part and said probability that said another defect happens in said another surrounding part being used to calculate said probability that no defect happens on said photomask.

2. A substrate-selecting equipment as claimed in claim 1, wherein said at least one defect-registering part includes a pinhole defect-registering part and a foreign substance defect-registering part,
said pinhole defect-registering part registering a result of a pinhole defect of a blank, said blank being said substrate without said photosensitive material layer thereon, and
said foreign substance defect-registering part registering a result of a foreign substance existing in said substrate provided with said photosensitive material layer thereon,
said result of said inspection being one of said result of said pinhole defect and said result of said foreign substance,
said defect being one of said pinhole defect and said foreign substance.

3. A substrate-selecting equipment as claimed in claim 1, further comprising:
a selection standard-registering part, said selection standard-registering part registering a quality standard within said database; and
an in pattern area existing defect extracting part, said in pattern area existing defect extracting part extracting said defect existing in a pattern area of a photomask for said objective substrate based upon said result of said inspection and said result of said lot check,
wherein said objective substrate is selected by said substrate-selecting part based upon said quality standard.

4. A substrate-selecting equipment as claimed in claim 1, further comprising:
an in pattern area existing defect extracting part, said in pattern area existing defect extracting part extracting said defect existing in a pattern area of a photomask for said objective substrate based upon said result of said inspection and said result of said lot check.

5. A substrate-selecting equipment as claimed in claim 1, further comprising:
- a selection standard-registering part, said selection standard-registering part registering a quality standard within said database; and
- an in pattern area existing defect extracting part, said in pattern area existing defect extracting part extracting said defect existing in a pattern area of a photomask for said objective substrate based upon said result of said inspection and said result of said lot check,
- wherein said objective substrate is selected by said substrate-selecting part based upon said quality standard.

6. A substrate-selecting equipment comprising:
- at least one defect-registering part; a photosensitive material layer lot check result-registering part; a substrate-selecting part and a defect probability-calculating part, wherein:
- said at least one defect-registering part registers within a database a result of inspection, said inspection being for a defect,
- said photosensitive material layer lot check result-registering part registers within said database a result of a lot check for a photosensitive material layer on a substrate,
- said substrate-selecting part selects an objective substrate from more than one said substrate, said objective substrate being selected by said substrate-selecting part based upon said result of said inspection and said result of said lot check,
- based upon said result of said inspection and said result of said lot check, said defect probability-calculating part performs a calculation for said objective substrate of the probability that no defect happens on a photomask,
- said calculation being used by said substrate-selecting part to select said objective substrate,
- said defect and a pattern area are within a defect area, said defect area being larger than said defect,
- a location of said defect area corresponding to a defect position on said photomask,
- said defect probability-calculating part calculates the probability that said defect happens inside of said pattern area and calculates the probability that another defect happens inside of another pattern area of said photomask, and
- said probability that said defect happens inside of said pattern area and said probability that said another defect happens inside of said another pattern area being used to calculate said probability that no defect happens on said photomask.

7. A substrate-selecting equipment as claimed in claim 6, wherein said at least one defect-registering part includes a pinhole defect-registering part and a foreign substance defect-registering part,
- said pinhole defect-registering part registering a result of a pinhole defect of a blank, said blank being said substrate without said photosensitive material layer thereon, and
- said foreign substance defect-registering part registering a result of a foreign substance existing in said substrate provided with said photosensitive material layer thereon,
- said result of said inspection being one of said result of said pinhole defect and said result of said foreign substance,
- said defect being one of said pinhole defect and said foreign substance.

8. A substrate-selecting equipment as claimed in claim 6, further comprising:
- an in pattern area existing defect extracting part, said in pattern area existing defect extracting part extracting said defect existing in said pattern area of said photomask for said objective substrate based upon said result of said inspection and said result of said lot check.

9. A substrate-selecting equipment as claimed in claim 6, further comprising:
- a selection standard-registering part, said selection standard-registering part registering a quality standard within said database; and
- an in pattern area existing defect extracting part, said in pattern area existing defect extracting part extracting said defect existing in said pattern area of said photomask for said objective substrate based upon said result of said inspection and said result of said lot check,
- wherein said objective substrate is selected by said substrate-selecting part based upon said quality standard.

* * * * *